United States Patent
Miyakawa et al.

(10) Patent No.: US 7,201,969 B2
(45) Date of Patent: Apr. 10, 2007

(54) PRESSURE-SENSITIVE ADHESIVE FILM FOR THE SURFACE PROTECTION OF SEMICONDUCTOR WAFERS AND METHOD FOR PROTECTION OF SEMICONDUCTOR WAFERS WITH THE FILM

(75) Inventors: Masafumi Miyakawa, Nagoya (JP); Makoto Kataoka, Sodegaura (JP); Jun Nakashima, Nagoya (JP); Yoshihisa Saimoto, Nagoya (JP); Shinichi Hayakawa, Nagoya (JP); Yasuhisa Fujii, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/507,245

(22) PCT Filed: Mar. 26, 2003

(86) PCT No.: PCT/JP03/03706

§ 371 (c)(1),
(2), (4) Date: Sep. 10, 2004

(87) PCT Pub. No.: WO03/081653

PCT Pub. Date: Oct. 2, 2003

(65) Prior Publication Data

US 2005/0203250 A1    Sep. 15, 2005

(30) Foreign Application Priority Data

Mar. 27, 2002 (JP) .............................. 2002-087438

(51) Int. Cl.
B32B 27/30 (2006.01)
(52) U.S. Cl. ...................... 428/522; 525/192; 525/193; 525/194; 525/195; 525/196
(58) Field of Classification Search ................ 525/192, 525/193, 194, 195, 196; 428/522
See application file for complete search history.

(56) References Cited

U.S. PATENT DOCUMENTS

| 6,187,874 B1 | 2/2001 | Yoshioka et al. | |
| 2003/0055171 A1* | 3/2003 | Overbeek et al. | ........... 525/192 |
| 2005/0158475 A1* | 7/2005 | Bell et al. | ................... 427/402 |

FOREIGN PATENT DOCUMENTS

| EP | 0 539 973 A2 A | 5/1993 |
| GB | 2 312 429 A | 10/1997 |
| JP | 60-189938 A | 9/1985 |
| JP | 5-335288 A | 12/1993 |
| JP | 5-335411 A | 12/1993 |
| JP | 6-73347 A | 3/1994 |
| JP | 6-77192 A | 3/1994 |
| JP | 6-77193 A | 3/1994 |
| JP | 9-255933 A | 9/1997 |
| JP | 10-189504 A | 7/1998 |
| JP | 10-1899504 A | 7/1998 |
| JP | 11-315259 A | 11/1999 |
| JP | 2000-8010 A | 1/2000 |
| JP | 2001-19932 A | 1/2001 |
| JP | 2001-72951 A | 3/2001 |
| JP | 2001-200215 A | 7/2001 |

OTHER PUBLICATIONS

English translation of JP 9-255933 published Sep. 30, 1997*.
English translation of JP 2001-199932 published Jul. 24, 2001*.
English tranlation of JP 2001-72951 publishedd Mar. 21, 2001*.

* cited by examiner

Primary Examiner—Jeffrey Mullis
(74) Attorney, Agent, or Firm—Buchanan, Ingersoll & Rooney PC

(57) ABSTRACT

A surface protecting adhesive film for a semiconductor wafer in which an adhesive layer is formed on one surface of a base film, wherein the adhesive layer comprises 100 weight parts of a polymer (A) having a functional group capable of reacting with a cross-linking agent and a temperature in a range of from −50° C. to 5° C. at which tan δ of a dynamic viscoelasticity is maximized, from 10 weight parts to 100 weight parts of a polymer (B) having a functional group capable of reacting with a cross-linking agent and a temperature in a range of from more than 5° C. to 50° C. at which tan δ of a dynamic viscoelasticity is maximized, and from 0.1 weight part to 10 weight parts of a cross-linking agent (C) having more than 2 cross-linking reactive functional groups in a molecule based on 100 weight parts of total amount of the polymers (A) and (B), and the surface protecting adhesive film for a semiconductor wafer which the thickness of the adhesive layer is from 5 μm to 50 μm has an excellent adhesion, prevention of breakage and contamination resistance.

4 Claims, No Drawings

PRESSURE-SENSITIVE ADHESIVE FILM FOR THE SURFACE PROTECTION OF SEMICONDUCTOR WAFERS AND METHOD FOR PROTECTION OF SEMICONDUCTOR WAFERS WITH THE FILM

TECHNICAL FIELD

The present invention relates to surface protecting adhesive films for semiconductor wafers and protecting methods for semiconductor wafers using the adhesive films. More particularly, the present invention relates to a surface protecting adhesive film for a semiconductor wafer which is adhered via an adhesive layer to a surface of a semiconductor wafer in a side in which a circuit is formed (hereinafter referred to also as wafer surface), when a non circuit-formed surface of a semiconductor wafer (hereinafter referred to also as wafer back side) is ground to thin the appropriate semiconductor wafer in order to avoid breakage or contamination of a semiconductor wafer at a production step of a semiconductor integrated circuit, and a protecting method for a semiconductor wafer using the adhesive film.

BACKGROUND ART

A semiconductor device is ordinarily produced by a method in which high purity silicon monocrystal or the like is sliced to produce a wafer and, then, an integrated circuit is embedded in the thus-produced wafer by ion implantation, etching or the like and, thereafter, the wafer thus embedded with the integrated circuit is subjected to back side grinding processing in which a side of the wafer is mechanically ground by means of grinding, lapping, polishing or the like to allow it to be thin and, subsequently, the thus-ground wafer is subject to dicing processing to produce a chip. Ordinarily, in order to avoid breakage or contamination of the wafer in a step of grinding the back side of the wafer among these steps as described above, a surface protecting adhesive film for a semiconductor wafer has been used.

Specifically, a surface protecting adhesive film for a semiconductor wafer is adhered to a surface of a semiconductor wafer via an adhesive layer thereof to protect the wafer surface and, then, a back side of the wafer is mechanically ground. After such grinding, a chemical treatment step may subsequently be carried out on the back side of the wafer as required. After these steps of processing the back side are completed, the adhesive film is peeled away from the wafer surface.

As one of performances required for such a surface protecting adhesive film for a semiconductor wafer as described above, there can be mentioned prevention of penetration of cooling water (hereinafter referred to also as grinding water) used in grinding a back side of a semiconductor wafer. There has been a case in which an unevenness hollowed in a shape of groove from the outermost portion of a wafer derived from a coating layer made of polyimide or the like, a vapor deposited layer such as a silicon oxide layer, a silicon nitride layer or the like, a scribe line (dicing street) or the like is present on a wafer surface. Ordinarily, the depth of the unevenness hollowed in a shape of groove is about from 2 μm to 20 μm. In grinding a back side of a semiconductor wafer in which the unevenness present on the wafer surface reaches to the outermost portion of the wafer, if an adhesiveness to the unevenness of an adhesive layer is not sufficient, grinding water might be entered through the unevenness in some cases. In case grinding water is entered between the wafer surface and an adhesive film through the unevenness, the adhesive film begins to be peeled away from the wafer surface by the thus-entered grinding water and such penetration of grinding water becomes accelerated between the wafer surface and the adhesive layer so that it tends to contaminate a whole surface of the integrated circuit by a grinding dust entered along with grinding water. At worst cases, a surface protecting adhesive film is totally delaminated during the grinding processing on the back side under the influence of the penetrated grinding water, thereby resulting in wafer breakage in some cases.

In order to prevent such a problem, a device to enhance adhesiveness between the unevenness of the wafer surface and the adhesive layer by heightening a thickness of the adhesive layer of the adhesive film has been required. However, in using this device, as an adhesive force to the wafer surface of an adhesive film was increased more than strength of the wafer, the peeling trouble happened in an automatic detaping machine when the adhesive film was peeled away from the wafer surface after back grinding depending on various conditions such as the thickness of the wafer and shape of the surface and the like; therefore, workability became deteriorated or the semiconductor wafer was completely broken in some cases. Further, there were cases where the depth of the unevenness was exceeding 20 μm depending on the wafer types. In order to handle such wafers, when the adhesive layer was made thicker, productivity of the adhesive film was worsened thereby increasing a production cost, which made it difficult to provide an inexpensive adhesive film. Therefore, this has not been a practical solution.

As a device to solve a problem of penetration of grinding water in grinding on the back side as described above, JP60-189938A discloses a protecting method for a semiconductor wafer in which a pressure-sensitive adhesive film is adhered to the wafer surface in grinding on the back side of a semiconductor wafer and after the wafer back side is ground, the adhesive film is peeled, wherein the pressure-sensitive adhesive film is made of a light transmitting supporting body and a pressure-sensitive adhesive layer having a property capable of curing by light irradiation formed on the light-transmitting supporting body to form a three-dimensional network and light irradiation is carried out to the adhesive film before peeling the adhesive film after grinding.

The protecting method of a semiconductor wafer disclosed in the above-mentioned invention might reduce an adhesive force to the wafer surface of an adhesive film by means of a light irradiation before peeling, and an adhesion to the wafer surface can be greatly heightened during grinding without considering workability at the time of peeling and the breakage of the wafer so that a problem in penetration of grinding water and grinding dust between the above-described wafer surface and the adhesive layer can be solved.

However, the adhesive film comprises low molecular weight compounds such as light initiator, photo-curable oligomer and the like in the adhesive layer in order to give a property to cure by light irradiation and to form a three-dimensional network to the pressure-sensitive adhesive layer. The adhesive layer may not be sufficiently cured depending on various conditions such as the shape of a wafer surface, strength or time of light irradiation, or the like in some cases. An adhesive residue problem may occur due to these low molecular weight compounds remained unreacted on the wafer surface after peeling in some cases. In order to prevent this problem, it is required to fill a light-irradiating device with inert gas such as nitrogen or the like, thereby causing problems of increasing a production cost, and at the same time making process large and complicated.

Further, in a publication of JP05-335288A is disclosed a protective member for a semiconductor wafer characterized in that a pressure-sensitive adhesive layer is provided on the supporting sheet and gel fraction of the pressure-sensitive adhesive layer is 40% or more, and a water-soluble polymer is included. The protective member (adhesive film) for the semiconductor wafer disclosed in this invention comprises a water soluble polymer on a pressure-sensitive adhesive layer, which enables a rinsing treatment in a sufficiently clear and clean manner by directly rinsing with water without pre-rinsing with an organic solvent after peeling the protective member away from a circuit pattern-formed surface or the like. Therefore, the above rinsing with an organic solvent can be omitted. Further, protective functions such as prevention of penetration of water into the adhesive interface, contamination of a circuit pattern-formed surface due to an adhesive residue, breakage of the wafer by the peeling at the time of grinding processing on the wafer back side and the like are disclosed. Also is disclosed that the easiness of peeling is satisfactory to prevent breakage of a grinding wafer at the time of peeling and a water soluble polymer attached on the semiconductor wafer by bleed can be easily cleaned with a water rinsing as well.

However, when this protective member was used for protecting the wafer surface in grinding the back side of a semiconductor wafer, a cohesive force of the adhesive layer was deteriorated due to a bled water soluble polymer and an adhesive residue was generated due to breakage of cohesion in peeling the protective member from the wafer depending on various conditions such as shape of the wafer surface, back grinding conditions, peeling conditions and the like, thereby contaminating the wafer surface in some cases. Such an adhesive residue resulting from breakage of cohesion might not be completely removed even by water rinsing, thereby causing problems of packaging failure or the like in post-processing in some cases.

In recent year, thinning of semiconductor integrated circuit chips for hand-held information terminal, IC cards and the like has been in high demand. The thickness of the semiconductor wafer used for the above-described purposes has been generally thinned less than 200 µm by the back grinding processing and the wafer has been ground until it has been thinned as low as about 50 µm in some cases. The thinner the thickness is after grinding, it takes more time for grinding, which means the time to expose to cooling water in grinding. Accordingly, contamination or breakage of the wafer becomes much higher due to penetration of water during the foregoing grinding under the grinding conditions to thin the wafer until the thickness becomes 200 µm or less. Further, the shape of the integrated circuit surface tends to be complicated according to high performance of the chip and technical innovation of the semiconductor production process and even the unevenness of a wafer surface having a depth of more than 20 µm appears. Some might reach to about 50 µm.

In addition, in a publication of JP05-335411A is disclosed a method of producing a semiconductor chip in which the wafer is ground from the back side after grooves having predetermined depth are formed from the surface of the wafer. Depth of grooves formed on the wafer used for such a method of producing a semiconductor chip is various depending on the thickness of the chips. Depth ranges from about 30 µm for a thin groove to 200 µm or more for a deep groove. A protecting adhesive film for a semiconductor wafer has been needed, which can be used free from a possibility of contamination or breakage of the wafer due to penetration of water during the grinding processing even in a wafer where grooves having a predetermined depth from the surface used for such a method of producing of a semiconductor chip are formed.

Under these circumstances, on a surface protecting adhesive film for a semiconductor wafer, as an unevenness formed on the wafer surface is deep, grinding water is easily penetrated into the wafer through the unevenness or the thickness becomes thin after grinding and the wafer is exposed to grinding water for a long time, it has been required that an invention satisfies a performance of preventing penetration of water, which enables to effectively prevent penetration of water from the circuit surface at a higher level under grinding conditions that might highly be subject to penetration of water.

DISCLOSURE OF THE INVENTION

An object of the present invention, in view of the above-mentioned problems, is to provide a surface protecting adhesive film for a semiconductor wafer which has excellent adhesive properties and proper adhesive force in regard to a surface of a semiconductor wafer, which can prevent contamination and breakage of a wafer surface due to penetration of grinding water, and which does not break the wafer at the time of peeling and does not contaminate the wafer due to an adhesive residue remaining on the wafer surface after peeling, and a protecting method for a semiconductor wafer using the adhesive film.

The present inventors have conducted an extensive study as they have considered that it was important not to proceed with the peeling of the wafer surface from the adhesive layer even when grinding water began to penetrate through an unevenness, in order to effectively prevent grinding water from penetrating into as well as it was important to closely adhere an adhesive film to the unevenness of the wafer surface. As a result, they have found that the above problems could be solved by providing an adhesive layer having a predetermined thickness on one surface of a base film, which comprises at least two kinds of polymers having a temperature in a specific range respectively at which tan δ of a dynamic viscoelasticity was maximized and cross-linking agents with a specific composition to achieve the present invention.

That is, the present invention relates to a surface protecting adhesive film for a semiconductor wafer in which an adhesive layer is formed on one surface of a base film, the adhesive layer comprises 100 weight parts of a polymer (A) having a functional group capable of reacting with a cross-linking agent and having a temperature (Ta) in a range of from −50° C. to 5° C. at which tan δ of a dynamic viscoelasticity of the polymer (A) is maximized, from 10 weight parts to 100 weight parts of a polymer (B) having a functional group capable of reacting with a cross-linking agent and having a temperature (Tb) in a range of from more than 5° C. to 50° C. at which tan δ of a dynamic viscoelasticity of the polymer (B) is maximized, and from 0.1 weight part to 10 weight parts of a cross-linking agent (C) having two or more cross-linkable functional groups in a molecule based on 100 weight parts of total amount of the polymers (A) and (B), and a thickness of an adhesive layer is from 5 µm to 50 µm.

According to the present invention, it is preferable that a storage elastic modulus of at least one layer of a base film at 25° C. is from $1 \times 10^8$ to $1 \times 10^{10}$ Pa and a thickness of the base film is from 10 to 120 µm.

Further, according to the present invention, it is preferable that the polymers (A) and (B) are acrylic acid alkyl ester copolymers.

Further, according to another aspect of the present invention, there is provided a protecting method for the semiconductor wafer wherein the above-described surface protecting adhesive film for the semiconductor wafer is adhered to a circuit-formed surface of a semiconductor wafer via the adhesive layer thereof, a grinding processing is subsequently carried out on a non-circuit-formed surface of the semiconductor wafer and the surface protecting adhesive film for the semiconductor wafer is peeled away, as a protecting method for a semiconductor wafer using a surface protecting adhesive film for the semiconductor wafer.

Characteristics of the surface protecting adhesive film for the semiconductor wafer according to the present invention are in that an adhesive layer having a predetermined thickness is provided on a surface of the base film; the adhesive layer comprises two types of polymers (A) and (B) having temperatures in a range of from −50° C. to 5° C. and from more than 5° C. to 50° C. respectively at which tan δ of a dynamic viscoelasticity is maximized, preferably acrylic acid alkyl ester copolymers (A) and (B), and a cross-linking agent (C) having at least two cross-linkable functional group capable of reacting with a functional group of the above copolymers in a molecule with a specific composition as main components.

By applying the above-described arrangements, an adhesive film can be adhered to an unevenness of the semiconductor wafer and at the same time, a peeling progress of the adhesive layer and the wafer surface can be suppressed, for example, even though grinding water begins to penetrate through the unevenness. Accordingly, contamination of the wafer surface and breakage of the wafer due to penetration of grinding water and grinding dust can be greatly and effectively prevented. In addition, an adhesive film can be peeled with a proper adhesive force in peeling and further no adhesive residue remains on the wafer surface after peeling.

A relation between the above arrangements and effects to be resulted from adopting these arrangements is not specifically defined, but can be estimated as follows. Of at least two types of copolymers in the adhesive layer, (A) having a relatively lower temperature in a range of from −50° C. to 5° C. at which tan δ of a dynamic viscoelasticity is maximized gives a proper flexibility to the adhesive layer and has an effect on sufficient adhesion of the adhesive film to the unevenness present on the wafer surface in adhering an adhesive film to the surface of the semiconductor wafer.

Further, the adhesive layer comprises from 10 weight parts to 100 weight parts of (B) having a relatively higher temperature in a range of from more than 5° C. to 50° C. at which tan δ of a dynamic viscoelasticity is maximized based on 100 weight parts of (A) to maintain an excellent adhesion to the above-described unevenness. In that state, (B) gives a proper strength to an extent that the adhesive layer can endure loads of peeling the adhesive film by grinding water, which enables to prevent penetration of water not to allow to proceed with peeling the adhesive layer from the wafer surface. In addition to the above arrangements, the adhesive layer comprises form 0.1 weight part to 10 weight parts of a cross-linking agent based on 100 weight parts of total amount of these polymers (A) and (B) and a thickness of the adhesive layer is from 5 µm to 50 µm, thereby realizing a proper adhesive force that enables peeling without wafer breakage and contamination resistance without an adhesive residue after peeling at the same time.

Additionally, the surface protecting adhesive film for the semiconductor wafer adopting the arrangement of the present invention is desirably used in a method of producing a semiconductor chip in which grooves having a predetermined depth are formed from the wafer surface and then the thus-formed grooves are ground from the back side because the adhesive film is superior in preventing penetration of grinding water and in contamination resistance.

Further, it is preferable that the storage elastic modulus (E') of the base film forming an adhesive layer is in a relatively higher range of from $1 \times 10^8$ to $1 \times 10^{10}$ Pa, the thickness is in a range of from 10 µm to 120 µm in order to have strength for the adhesive film to endure loads imposed in the direction of peeling the adhesive film by grinding water entering into an interface between the adhesive film and the wafer surface, and prevent a progress of delamination of the adhesive film.

Further, temperatures (Ta) and (Tb) at which tan δ of a dynamic viscoelasticity of polymers (A) and (B) in the present invention is maximized are intended to mean values measured by a method explained in an embodiment to be described below.

BEST MODE FOR CARRYING OUT THE INVENTION

The present invention will be described in more detail below.

Firstly, a surface protecting adhesive film for a semiconductor wafer according to the present invention will be described. The surface protecting adhesive film for the semiconductor wafer according to the present invention is produced by preparing a base film and forming an adhesive layer on one surface of the base film. Ordinarily, a surface of the adhesive layer is applied with a release film referred to as a separator, from the standpoint of prevention of contamination thereof, in a period of from the time right after it is produced to the time it is used. Considering that the adhesive film is adhered to the surface of the semiconductor wafer via the surface of the adhesive layer to be exposed after peeling the release film, in order to prevent contamination of the surface of the semiconductor wafer due to an adhesive layer, it is preferable that the adhesive agent coating solution is applied on one surface of a release film and dried to form an adhesive layer and, then the thus-formed layer is transferred to one surface of the base film.

As the base film of the surface protecting adhesive film for the semiconductor wafer according to the present invention, a film, which is produced by processing a synthetic resin in film form, is used. The base film may be a single-layer film or a laminate of two or more layers of film. Further, the base film may be produced by processing a thermoplastic resin or by subjecting a curable resin to film-making processing and, then, curing the resultant film. When the base film becomes thin, there is a tendency in which a property of the base film to maintain a feature of the adhesive film becomes deteriorated (weaker) and, along with such deterioration, workability at the time of handling the adhesive film becomes deteriorated in some cases. On the other hand, when the base film becomes thick, productivity of the base film is affected thereby increasing a production cost. Under these circumstances, the thickness of the base film is preferably from 10 µm to 120 µm and more preferably from 10 µm to 110 µm.

As for the raw material resins to be used in base films, there can be exemplified, for example, polyethylene, polypropylene, polybutene, polymethylpentene, an ethylene-vinyl acetate copolymer, an ethylene-ethylacrylate copolymer, an ethylene-acrylic acid ester-maleic anhydride copolymer, an ethylene-glycidyl methacrylate copolymer, an ethylene-methacrylic acid copolymer, an ionomer resin, an ethylene-propylene copolymer, a thermoplastic elastomer such as a butadiene-type elastomer, a styrene-isoprene-type elastomer or the like, a polystyrene-type resin, polyvinyl chloride resin, a polyvinylidene chloride-type resin, a polyamide-type resin, a polyester such as polyethylene terephthalate (PET), polyethylene naphthalate (PEN), polybutylene terephthalate (PBT) or the like, polyimide, polyether sulfone (PES), polyether ether ketone (PEEK), polycarbonate, polyurethane, an acrylic resin, a fluorine-type resin, a cellulose-type resin and the like.

The base film has a storage elastic modulus (E') at 25° C. of from $1\times10^8$ to $1\times10^{10}$ Pa and preferably from $5\times10^8$ to $1\times10^{10}$ Pa, and a thickness of from 10 μm to 120 μm and preferably from 10 μm to 110 μm.

A method to processing a synthetic resin in a film form includes known techniques such as a calender method, a T-die extrusion method, an tubular film extrusion method, a cast method and the like. The base film can be appropriately selected from those produced by those known techniques in consideration of productivity, thickness accuracy of the film to be obtained or the like. In order to enhance adhesive force between the base film and the adhesive layer, it is preferable that a corona discharge treatment or a chemical treatment is preliminarily carried out on the surface of the base film in a side in which the adhesive layer is provided. Further, for the same purpose, a primer layer may be formed between the base film and the adhesive layer.

As a more preferred embodiment of the base film to be used in the present invention, relatively flexible synthetic resins subjected to molding processing to be in film form may be laminated on the surface of the base film opposite to the side in which the adhesive layer is provided; the relatively flexible synthetic resins have a storage elastic modulus (E') at 25° C. of less than $1\times10^8$ Pa. As for such a relatively flexible synthetic resin, there can be exemplified, for example, an ethylene-vinyl acetate copolymer, an ethylene-alkyl acrylate copolymer (alkyl group having 1 to 4 carbon atoms), a low-density polyethylene, an ethylene-α-olefin copolymer (α-olefin having 3 to 8 carbon atoms) and the like. Of these, an ethylene-vinyl acetate copolymer is preferred. An ethylene-vinyl acetate copolymer having the content of the vinyl acetate unit of from 5 weight % to 50 weight % is more preferable. Further, the thickness of these relatively flexible synthetic resin film layers is preferably from 10 μm to 200 μm.

A typical method of laminating synthetic resins processed in film form when the base film is a laminate of two or more layers of film is a method in which while extrusion-molding a synthetic resin with a T-die extruder, the base film is laminated with one surface of a synthetic resin film prepared in advance. In order to enhance an adhesive force between these synthetic resin films, a simple adhesive treatment such as a corona discharge treatment or a chemical treatment may be carried out on one surface in a side which each synthetic resin film is laminated or an adhesive layer may be formed between two layers.

As release films, there can be exemplified, for example, synthetic resin films such as a polypropylene film, a polyethylene terephthalate film (hereinafter referred to also as PET film) and the like. Optionally, a treatment for facilitating release such as silicone treatment or the like is preferably carried out on a surface thereof. The thickness of the release film is ordinarily from about 10 μm to 1000 μm.

The adhesive layer of the surface protecting adhesive film for the semiconductor wafer according to the present invention comprises two types of polymers (A) and (B) having a functional group capable of reacting with a cross-linking agent and having different temperatures respectively in a specific range at which tan δ of a dynamic viscoelasticity is maximized, and a cross-linking agent having more than two cross-linkable functional groups in a molecule in order to control a cohesive force and an adhesive force.

As for two types of polymers (A) and (B) having a functional group capable of reacting with a cross-linking agent, there can be exemplified, for example, a natural rubber-type polymer, a synthetic rubber-type polymer, a silicone rubber-type polymer, an acrylic rubber-type polymer (acrylic acid alkyl ester copolymer).

Of these, an acrylic acid alkyl ester copolymer will be described as a typical example. Of these two types of acrylic acid alkyl ester copolymers, an acrylic acid alkyl ester copolymer (A) having a temperature (Ta) in a relatively low range of from −50° C. to 5° C. at which tan δ of a dynamic viscoelasticity is maximized gives a proper flexibility to the adhesive layer and, when adhering an adhesive film to the surface of the semiconductor wafer, has an effect on sufficient adhesion of the adhesive film to the unevenness present on the wafer surface. On the other hand, an acrylic acid alkyl ester copolymer (B) having a temperature (Tb) in a relatively high range of from more than 5° C. to 50° C. at which tan δ of a dynamic viscoelasticity is maximized gives a proper strength to the adhesive layer to an extent that it can endure loads of peeling the adhesive film by grinding water, does not allow to proceed with peeling the adhesive layer from the wafer surface, and prevents penetration of water.

In consideration of the characteristics of these (A) and (B), an object of the present invention is not only to more closely adhere the adhesive layer to the unevenness of the wafer surface, but also to prevent any proceeding with peeling the adhesive layer from the wafer surface even when grinding water begins to enter through the unevenness. In order to achieve the object of the present invention, the adhesive layer preferably includes from 10 weight parts to 100 weight parts of (B) per 100 weight parts of (A). When the content of (B) becomes large, the adhesion to the wafer surface of the adhesive layer becomes weak whereupon grinding water is more easily entered into the unevenness of the wafer surface to contaminate or break the wafer in some cases. When the content of (B) is small, the adhesive layer is not strong enough whereupon the adhesive layer cannot endure loads to the adhesive layer from grinding water that make the adhesive film peeled away thereby proceeding with peeling the adhesive layer from the wafer surface and causing contamination or breakage of the wafer as well in some cases.

The acrylic acid alkyl ester copolymer preferably includes an acrylic acid alkyl ester, a methacrylic acid alkyl ester and mixtures thereof as main monomers. As for such acrylic acid alkyl esters and methacrylic acid alkyl esters, there can be exemplified, for example, methyl acrylate, methyl methacrylate, ethyl acrylate, ethyl methacrylate, n-butyl acrylate, n-butyl methacrylate, 2-ethylhexyl acrylate, 2-ethylhexyl methacrylate, octyl acrylate and the like. These monomers may be used either alone or in mixtures thereof. A quantity of a main monomer to be used is preferably in a range of from 60 weight % to 99 weight % of a total quantity of all monomers which are raw materials of the polymer. By using a mixture of monomers having such compositions, an acrylic acid alkyl ester copolymer having an acrylic acid alkyl ester unit, a methacrylic acid alkyl ester unit and a unit of mixture of these monomers each of which has about the same composition can be obtained.

These acrylic acid alkyl ester copolymers need to have a functional group capable of reacting with a cross-linking agent. As for such functional groups capable of reacting with a cross-linking agent, there can be exemplified, for example, a hydroxyl group, a carboxyl group, an epoxy group, an amino group and the like. As a method for introducing the functional group capable of reacting with a cross-linking agent into the copolymer, a method of copolymerizing a comonomer having such a functional group at the time of polymerizing an acrylic acid alkyl ester copolymer has generally been used.

As for comonomers having the above-described functional group, there can be exemplified, for example, acrylic acid, methacrylic acid, itaconic acid, mesaconic acid, citraconic acid, fumaric acid, maleic acid, an itaconic acid monoalkyl ester, a mesaconic acid monoalkyl ester, a citraconic acid monoalkyl ester, a fumaric acid monoalkyl ester, a maleic acid monoalkyl ester, 2-hydroxyethyl acrylate, 2-hydroxyethyl methacrylate, acrylamide, methacrylamide, tert-butylaminoethyl acrylate, tert-butylaminoethyl methacrylate and the like.

One type of the above-described comonomers may be copolymerized with the above-described main monomer, or two or more types thereof may be copolymerized with the above-described main monomer. A quantity (copolymerization quantity) of the above-described comonomer having a functional group capable of reacting with a cross-linking agent, to be used is preferably in a range of from 1 weight % to 40 weight % of a total quantity of all monomers which are raw materials of the acrylic acid alkyl ester copolymer. By using a mixture of monomers having such compositions, a polymer having a comonomer unit which has about the same composition can be obtained.

According to the present invention, in addition to main monomers which constitute the above-described acrylic acid alkyl ester copolymers and comonomers having a functional group capable of reacting with a cross-linking agent, a specified comonomer (hereinafter referred to also as polymerizable surfactant) having characteristics of a surfactant may be copolymerized. The polymerizable surfactant not only has a property of copolymerizing with the main monomer or the comonomer but also has an action as an emulsifying agent when emulsion polymerization is conducted. When an adhesive polymer which has been emulsion polymerized by using the polymerizable surfactant is used, contamination on the wafer surface due to the surfactant is not ordinarily generated. Further, even when a small contamination resulting from the adhesive layer occurs, it is possible to easily remove such contamination by washing the wafer surface.

As for such polymerizable surfactants, there can be exemplified, for example, a surfactant produced by introducing a polymerizable 1-propenyl group in a benzene ring of polyoxyethylene nonylphenyl ether (product names: AQUALON RN-10, AQUALON RN-20, AQUALON RN-30, AQUALON RN-50 or the like, manufactured by Daiichi Kogyo Seiyaku Co., Ltd.), another surfactant produced by introducing a polymerizable 1-propenyl group in a benzene ring of an ammonium salt of a sulfuric acid ester of a polyoxyethylene nonylphenyl ether (product names: AQUALON HS-10, AQUALON HS-20 or the like, manufactured by Daiichi Kogyo Seiyaku Co., Ltd.), another surfactant which has a polymerizable double bond in the molecule and is of a sulfosuccinic acid diester type (product names: Latemul S-120A, Latemul S-180A or the like, manufactured by Kao Corporation) and the like.

Further, optionally, a monomer having a self-cross-linkable functional group such as acrylic acid glycidyl, methacrylic acid glycidyl, isocyanate ethyl acrylate, isocyanate ethyl methacrylate, 2-(1-aziridinyl) ethyl acrylate, 2-(1-aziridinyl) ethyl methacrylate, or the like, a monomer having a polymerizable double bond such as vinyl acetate, acrylonitrile, styrene or the like, a multifunctional monomer such as divinyl benzene, acrylic acid vinyl, methacrylic acid vinyl, acrylic acid allyl, methacrylic acid allyl or the like and other representative commercial products in which, for example, both ends are a diacrylate or a dimethacrylate and a structure of a main chain is propylene glycol (product names: PDP-200, PDP-400, ADP-200 and ADP-400, manufactured by Nippon Oils and Fats Co., Ltd.), tetramethylene glycol (product names: ADT-250 and ADT-850, manufactured by Nippon Oils and Fats Co., Ltd.) and a mixture thereof (product names: ADET-1800 and ADPT-4000, manufactured by Nippon Oils and Fats Co., Ltd.), and the like may be copolymerized. When a monomer having a self-cross-linkability, a monomer having a polymerizable double bond and a multifunctional monomer are copolymerized, a quantity of these monomers to be used is preferably from 0.1 weight % to 30 weight % of all monomers.

As for a polymerization reaction mechanism when polymerizing an acrylic acid alkyl ester, there can be exemplified, for example, a radical polymerization, an anionic polymerization, a cationic polymerization or the like. When a production cost of the adhesive agent, an effect of the functional group of the monomer, an effect of an ion on the semiconductor surface and the like are taken into consideration, it is preferable to perform polymerization by the radical polymerization. When polymerization is carried out by a radical polymerization reaction, as for a radical polymerization initiator, there can be exemplified, for example, an organic peroxide such as benzoyl peroxide, acetyl peroxide, isobutyryl peroxide, octanoyl peroxide, di-tertiary-butyl peroxide, di-tertiary-amyl peroxide or the like, an inorganic peroxide such as ammonium persulfate, potassium persulfate, sodium persulfate or the like, an azo compound such as 2,2'-azobisisobutyronitrile, 2,2'-aziobis-2-methylbutyronitrile, 4,4'-azobis-4-cyanovaleric acid or the like.

Further, when the acrylic acid alkyl ester copolymer is polymerized by the radical polymerization reaction, for the purpose of adjusting a molecular weight of the adhesive polymer or the like, a chain transfer agent may be added as needed. As for such chain transfer agents, exemplified are mercaptans such as, for example, tertiary-dodecyl mercaptan, normal-dodecyl mercaptan and the like. A quantity of the chain transfer agents to be used is in a range of from 0.001 weight part to 0.5 weight part based on 100 weight parts of total amount of monomers.

The polymerization method of the acrylic acid alkyl ester copolymers can appropriately be selected from the known polymerization methods such as an emulsion polymerization method, a suspension polymerization method, a solution polymerization method and the like and used. Particularly, when prevention of contamination on the wafer surface of the adhesive layer is taken into account, it is preferable to adopt the emulsion polymerization method by which a copolymer having a high molecular weight can be obtained.

When the acrylic acid alkyl ester copolymer is polymerized by the emulsion polymerization method, among the foregoing radical polymerization initiators, a water-soluble inorganic peroxide such as ammonium persulfate, potassium persulfate, sodium persulfate or the like, a water-soluble azo compound having a carboxyl group in the molecule such as 4,4'-azobis-4-cyanovaleric acid or the like is preferable. When the effect of the ion on the surface of the semiconductor wafer is taken into consideration, a ammonium persulfate, azo-compound having a carboxyl group in the molecule such as 4,4'-azobis-4-cyanovaleric acid or the like is more preferable. An azo-compound having a carboxyl group in the molecule such as 4,4'-azobis-4-cyanovaleric acid or the like is particularly preferable.

Two types of the acrylic acid alkyl ester copolymers (A) and (B) can be polymerized together as described above. Subsequently, a controlling method of temperatures (Ta) and (Tb) at which tan δ of a dynamic viscoelasticity (hereinafter referred to also as tan δ) is maximized will be described. Temperatures (Ta) and (Tb) at which tan δ is maximized is influenced by factors such as (1) a type and quantity of a main monomer to be used which constitute an acrylic acid alkyl ester copolymer and (2) a type and quantity of a comonomer having a functional group capable of reacting with a cross-linking agent.

Firstly, as for (1) the type and quantity of the main monomer to be used which constitute an acrylic acid alkyl ester copolymer, in a case in which an acrylic acid alkyl ester is used as the main monomer, if an alkyl group has from 3 to 8 carbon atoms, a temperature at which tan δ is maximized tends to be lower as the number of carbon atoms of an alkyl group becomes higher. On the other hand, when an alkyl group contains 9 or more carbon atoms, a temperature at which tan δ is maximized tends to be higher as the number of carbon atoms of an alkyl group becomes higher. Further, in a case in which a methacrylic acid ester is used as the main monomer, a temperature at which tan δ is maximized tends to be higher. In either case, as the quantity of the main monomer becomes larger, the influence on a temperature at which tan δ is maximized becomes larger.

Therefore, ordinarily, in order to obtain the acrylic acid alkyl ester copolymer (A) in which a temperature (Ta) at which tan δ is maximized is in a relatively low range of from −50 to 5° C., it is preferable to mainly use acrylic acid alkyl esters each having an alkyl group having from 4 to 8 carbon atoms such as n-butyl acrylate, 2-ethylhexyl acrylate, octyl acrylate and the like. In order to obtain the acrylic acid alkyl ester copolymer (B) in which a temperature (Tb) at which tan δ is maximized is in a relatively high range of from 5° C. to 50° C., it is preferable to mainly use acrylic acid alkyl esters each having an alkyl group having from 2 to 3 carbon atoms such as methyl acrylate, ethyl acrylate and the like, and methacrylic acid alkyl ethers.

As for (2) the type and quantity (copolymerized quantity) of the comonomer to be used which has the functional group capable of reacting with a cross-linking agent, among such comonomers which are ordinarily used, a comonomer having a carboxyl group such as acrylic acid, methacrylic acid, itaconic acid or the like, or another comonomer having an amide group such as acrylamide, methacrylamide, N-methylol-acrylamide or the like, any one of methacrylic acid esters such as methacrylic acid glycidyl, 2-hydroxyethyl methacrylate and the like is used. In this case, a temperature at which tan δ is maximized ordinarily tends to shift to the side of high temperature. Such tendency is increased more, as the quantity to be used (copolymerized quantity) becomes larger.

Accordingly, ordinarily, in order to obtain the acrylic acid alkyl ester copolymer (A) in which a (Ta) at which tan δ is maximized is in a relatively low range of from −50° C. to 5° C., it is preferable that an added quantity of the comonomer having a tendency to shift the temperature at which tan δ is maximized to the side of high temperature becomes relatively small in the range described above. Further, in order to obtain the acrylic acid alkyl ester copolymer (B) in which a temperature (Tb) at which tan δ is maximized is in a relatively high range of from more than 5° C. to 50° C., it is preferable that an added quantity of the comonomer added becomes relatively large in the range described above.

As for cross-linking agents (C) having more than two cross-linkable functional groups in a molecule used in the present invention, there can be exemplified, for example, an epoxy-type cross-linking agent such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcin diglycidyl ether or the like, an aziridine-type cross-linking agent such as trimethylolpropane-tri-α-aziridinyl propionate, tetramethylolmethane-tri-β-aziridinyl propionate, N,N'-diphenylmethane-4,4'-bis (1-aziridine carboxylamide), N,N'-hexamethylene-1,6-bis(1-aziridine carboxylamide), N,N'-toluene-2,4-bis(1-aziridine carboxylamide), trimethylolpropane-tri-β-(2-methylaziridine) propionate or the like, an isocyanate-type cross-linking agent such as tetramethylene diisocyanate, hexamethylene diisocyanate, a tri adduct of toluene diisocyanate of trimethylolpropane, polyisocyanate or the like. These cross-liking agents may be used either alone or in mixtures thereof.

Further, when the adhesive agent is of an aqueous type such as an aqueous solution, an emulsion in which water is a medium or the like, an isocyanate-type cross-linking agent is fast in a deactivating speed due to a side reaction with water whereupon a cross-linking reaction with the adhesive agent polymer does not sufficiently progress in some cases. Therefore, in such cases, it is preferable that, among the above-described cross-linking agents, an aziridine-type or epoxy-type cross-linking agent is used.

A content of the cross-linking agent (C) having two or more cross-linkable functional groups in a molecule according to the present invention is from 0.1 weight part to 10 weight parts based on 100 weight parts of total amount of two kinds of the foregoing acrylic acid alkyl ester copolymers (A) and (B). When the content of the cross-linking agent is small, a cohesive force becomes insufficient to cause contamination on the wafer surface in some cases. When the content thereof is unduly large, the adhesive force between the adhesive layer and the wafer surface becomes weak and an adhesion of the adhesive layer against the unevenness of the wafer surface becomes insufficient whereupon water or grinding dust comes in therebetween during back grinding processing on the wafer to break the wafer or contaminate the wafer surface due to the grinding dust in some cases.

In the adhesive agents which constitute the adhesive layer according to the present invention, in addition to two kinds of the foregoing acrylic acid alkyl ester copolymers (A) and (B), and the cross-linking agent (C) having two or more cross-linkable functional groups in a molecule, in order to adjust adhesion characteristics, a tackifier of, for example, a rosin type, terpene resin type or the like, any of various types of surfactants or the like may appropriately be contained. Further, when the adhesive agent polymer is an emulsion, film-forming agents such as diethylene glycol monobutyl ether or the like may appropriately be contained to such an extent as does not affect an object of the invention.

Thickness of the adhesive layer of the surface protecting adhesive film for the semiconductor wafer in the present invention has an effect on an adhesion, an adhesive force and the like against the unevenness of the wafer surface. When the adhesive layer is thin, an adhesion against the unevenness of the wafer surface becomes insufficient and grinding water is entered through the unevenness to contaminate the wafer surface in some cases. When the adhesive layer is thick, there is a case in which the adhesion is increased against the unevenness of the wafer surface whereupon the adhesive force becomes high and deterioration of workability at the time of peeling is induced. In view of these features, the thickness of the adhesive layer is preferably from 5 µm to 50 µm and more preferably from 10 µm to 40 µm.

According to the present invention, when the adhesive layer is formed on one surface of the base film, a method can be used to form the adhesive layer in which the above-described adhesive agent is allowed to be in a form of a solution or an emulsion liquid (hereinafter generally referred to also as adhesive agent coating solution) and, then, the resulting coating solution is coated sequentially with a known method such as a roll coater, a comma coater, a die coater, a Meyer bar coater, a reverse roll coater, a gravure coater and the like and dried. On this occasion, in order to protect the thus-coated adhesive layer from contamination or the like derived from an environmental factors, a release film is preferably applied on a surface of the thus-coated adhesive layer. Alternatively, a method (hereinafter referred to also as transfer method) may be adopted, in which, on one surface of the release film, the adhesive agent coating solution is applied in accordance with the above-described known method and, then, dried to form the adhesive layer and, thereafter, using an ordinary method such as a dry lamination method or the like, the above-described layer is transferred to the base film having a storage elastic modulus at 25° C. in the above range.

A drying condition at the time of drying the adhesive agent coating solution is not limited to any particular type but, ordinarily, it is preferable to dry the adhesive agent coating solution at a temperature in a range of from 80° C. to 300° C. for a period of from 10 seconds to 10 minutes. Further, it is more preferable to dry it at from 80° C. to 200° C. for a period of from 15 seconds to 8 minutes. In the present invention, in order to promote the cross-linking reaction between the cross-linking agent and the acrylic acid alkyl ester copolymer to a great extent, after the adhesive agent coating solution is completely dried, the surface protecting adhesive film for the semiconductor wafer may be heated at a temperature of from 40° C. to 80° C. for a period of from 5 hours to 300 hours.

As for the adhesive force of the surface protecting adhesive film for the semiconductor wafer according to the present invention, when a protective property (prevention of penetration of grinding water, grinding dust and the like) of the wafer at the time of a grinding processing on the wafer back side or the like and peeling workability at the time of peeling the adhesive film away from the wafer are taken into consideration, the adhesive force measured on the basis of a method defined in JIS Z0237 using SUS304-BA plate as an adherend, at a peeling rate of 300 mm/min and a peeling angle of 180° is preferably within a range of from 1 N/25 mm to 15 N/25 mm. When the adhesive force is low, grinding water or the like sometimes makes penetration during the grinding processing on the wafer back side to break the wafer, to cause contamination on the wafer surface derived from the grinding dust or the like. When the adhesive force becomes high, the peeling workability is deteriorated to cause the wafer breakage at the time of peeling the adhesive film away from the wafer surface in some cases. Then, the adhesive force is more preferably in a range of from 1.5 N/25 mm to 12 N/25 mm.

Next, a surface protecting method for the semiconductor wafer according to the present invention will be described. The surface protecting method for the semiconductor wafer according to the present invention is a protecting method of the semiconductor wafer at the time of grinding a back side of the semiconductor wafer; on this occasion, the protecting method is characterized in that the above-described surface protecting adhesive film for the semiconductor wafer is used and the surface protecting adhesive film is applied to the surface of the semiconductor wafer for protection.

Details thereof will be described below. Firstly, the release film is peeled away from the adhesive layer of the surface protecting adhesive film for the semiconductor wafer (hereinafter referred to also as adhesive film) to expose a surface of the adhesive layer and, then, the adhesive film is applied to the surface of the semiconductor wafer via the thus-exposed adhesive layer. Next, the resulting semiconductor wafer is fixed on a chuck table of a grinding machine or the like via the base film layer of the adhesive film to grind a back side of the semiconductor wafer. After such grinding is completed, the adhesive film is peeled away from. In some cases, after such grinding of the wafer back side is completed but before the adhesive film is peeled away from, a chemical treatment step such as a chemical etching step, polishing step or the like on the wafer back side may be conducted. Further, after the adhesive film is peeled away from, cleaning processing such as water rinsing, plasma washing or the like may be carried out on the surface of the semiconductor wafer.

In operations such as the grinding processing, the chemical treatment and the like on the back side of the semiconductor wafer in such a series of steps, the semiconductor wafer, which ordinarily has a thickness of from 500 µm to 1000 µm before grinding the back side, is thinned to be ordinarily from 200 µm to 600 µm and sometimes to about 20 µm by means of grinding, depending on the type of the semiconductor wafer and the like. When the thickness of the wafer comes down to be less than 200 µm, in order to enhance strength of the wafer by removing a damaged layer generated on the back side of the wafer by mechanical grinding, a step of conducting a chemical treatment on the back side is carried out subsequent to a step of grinding the back side in some cases. The thickness of the semiconductor wafer before grinding is appropriately determined depending on the size, the type and the like of the semiconductor wafer, whereas the thickness thereof after grinding is appropriately determined depending on the size of the chip, the type of the circuit and the like.

An operation of applying the adhesive film to the semiconductor wafer is sometimes carried out manually but generally by an apparatus referred to as an automatic taping machine to which an adhesive film in a roll state is attached. As for such automatic taping machines, there can be exemplified, for example, ones which are available as Model: ATM-1000B and Model: ATM-1100 manufactured by Takatori Corporation, Model: STL series manufactured by Teikoku Seiki Kabushiki Kaisha, Model: DR-8500II manufactured by Nitto Seiki Inc. and the like.

As for the temperature at the time of applying the adhesive film to the semiconductor wafer, a room temperature of around 25° C. is ordinarily used; however, when the adhesive film is attached to the surface of the semiconductor wafer using the above-described automatic taping machine which is provided with a device for elevating the temperature of the wafer, a method to heat the wafer to an appropriate temperature (ordinarily from 40° C. to 90° C.) is used before an operation of applying the adhesive film thereon is carried out.

The method of grinding processing on the back side of the semiconductor wafer is not particularly limited and a known grinding method such as a through-feed method, an in-feed method or the like can be adopted. A grinding operation is preferably carried out while the semiconductor wafer and a whetstone are being watered to cool them. Examples of grinding machines for performing grinding processing on the back side of the wafer include ones which are available as Model: DFG-860 manufactured by Disco Corporation, as Model: SVG-502MKII8 manufactured by Okamoto Machine Tool Works. Ltd., as Model: Polish grinder PG200 manufactured by Tokyo Seimitsu Co., Ltd. and the like.

After the back grinding processing on the surface of the semiconductor wafer, the chemical treatment and the like on the back side of the semiconductor wafer are completed, the adhesive film is peeled away from the wafer surface. An operation of peeling the adhesive film away from the wafer surface may sometimes be conducted manually, but generally conducted by an apparatus referred to as an automatic detaping machine. As for such automatic detaping machine, there can be exemplified, for example, one which are available as Model: ATRM-2000B and Model: ATRM-2100 manufactured by Takatori Corporation, as Model: STP series manufactured by Teikoku Seiki Kabushiki Kaisha, as Model: HR-8500II from Nitto Seiki Inc. and the like. Further, as for an adhesive tape referred to as a detaping tape used at the time of peeling the surface protecting adhesive film for the semiconductor wafer away from the semiconductor wafer surface by the automatic detaping machines, for example, Highland-mark Filament Tape No. 897 available from Sumitomo 3M Limited and the like can be used.

Peeling the surface protecting adhesive film for the semiconductor wafer away from the surface of the semiconductor wafer is carried out at a room temperature of ordinarily around 25° C.; however, when the above-described automatic detaping machine is provided with a function for elevating the temperature of the wafer before an operation of peeling the adhesive film therefrom is carried out, the adhesive film may first be heated to an appropriate temperature (ordinarily from 40° C. to 90° C.) and then peeled therefrom.

The wafer surface after the adhesive film is peeled away is washed as required. As for the washing method, there can be exemplified, for example, wet washing such as water rinsing, solvent rinsing or the like, dry washing such as plasma washing or the like, and so forth. In the wet washing, ultrasonic washing may be used in combination. These washing methods are properly selected depending on the contamination condition on the wafer surface.

As semiconductor wafers to which the protecting method for the semiconductor wafer according to the present invention are applicable, exemplified are not only a silicon wafer but also wafers made of, for example, germanium, gallium-arsenic, gallium-phosphor, gallium-arsenic-aluminum and the like.

EXAMPLES

The present invention is now more specifically described with reference to preferred embodiments. In all of Examples and Comparative Examples to be described below, preparation, coating and grinding of a back side of a semiconductor wafer and the like have been carried out in an environment in which cleanliness of Class 1000 or less defined in the U.S. Federal Standard No. 209b is maintained. The present invention is not limited to these Examples. Further, in Examples, measuring methods of various feature values and practical performance evaluation have been measured in accordance with methods to be described below.

1. Measurement of an Adhesive Force (N/25 mm)

An adhesive force is measured according to a method regulated in JIS Z0237-1991 except for conditions defined below. The adhesive film obtained by each of Examples or Comparative Examples was applied to a surface of a 5 cm×20 cm SUS304-BA plate (defined in JIS G4305-1991) via the adhesive layer thereof, and then it was left to stand for 60 minutes in an atmosphere of 23° C. Thereafter, while an edge of a sample was tightly held, the adhesive film was peeled away from the surface of the SUS304-BA plate with a peel angle of 180° at a peel rate of 300 mm/min. Stress at the time of peeling is measured and converted in terms of N/25 mm.

2. Storage Elastic Modulus of a Base Film (E') (Pa)

A base film to be used for a surface protecting adhesive film for a semiconductor wafer was cut to prepare a rectangular sample (machine direction: 30 mm, direction perpendicular to a machine direction: 10 mm). A storage elastic modulus (machine direction) at 10 to 100° C. was measured using a dynamic viscoelasticity measurement apparatus (Model: RSA-II, manufactured by Rheometrics Co., Ltd., using an attachment for film tensile testing). A measurement frequency was 1 Hz. Specifically, the sample was set in the dynamic viscoelasticity measurement apparatus at 25° C. via the above-described attachment to measure the storage elastic modulus while it was heated from 10° C. up to 100° C. at a heating rate of 3° C./min. After such measurement has been completed, from such a storage elastic modulus-temperature curve at a temperature range of from 10° C. to 100° C. as obtained, a storage elastic modulus (E') (Pa) at 25° C. was adopted as the storage elastic modulus in the present invention.

3. Temperature (° C.) at which tan δ of a Dynamic Viscoelasticity of a Polymer is Maximized Under the same application conditions (drying temperature, drying time and the like) as those of Examples and Comparative Examples when each adhesive layer was prepared, an emulsion of each polymer shown in the Preparation Examples was applied onto a release-treated surface of a PET film (product name: Purex, manufactured by Teijin Dupont Films Limited) in which one surface thereof was subjected to silicone treatment, and dried to obtain a polymer layer having a thickness of 30 μm after drying. The thus-obtained polymer layers are overlapped in sequence with each other to produce a sample of a polymer in a film state having thickness of about 1 mm. From this sample in a film state, an adhesive layer in a disc-type shape having a diameter of about 8 mm and a thickness of about 1 mm was formed to obtain a sample. Storage elastic modulus of this sample is measured at a frequency of 1 rad/sec and in a temperature range of from −70° C. to 70° C. by using a dynamic viscoelasticity measurement apparatus (Model: RMS-800, manufactured by Rheometrics Co., Ltd.; using an attachment of parallel plate (parallel disc) type having a diameter of 8 mm). Specifically, the sample was set in the dynamic viscoelasticity measurement apparatus at 25° C. via the above-described attachment of parallel plate type to measure tan δ of a dynamic viscoelasticity while it is lowered from 25° C. up to −70° C. at a lowering rate of 3° C./min and it is heated from 25° C. to 70° C. at a heating rate of 3° C./min to measure tan δ of a dynamic viscoelasticity.

After such measurement has been completed, from such tan δ-temperature curve at a temperature range of from −70° C. to 70° C. as obtained, a temperature at which tan δ was maximized was read.

4. Practical Performance Evaluation

<Semiconductor Wafer for Evaluation>

The semiconductor silicone wafer (diameter: 200 mm, thickness: 725 μm, Dicing street hollowed in a shape of grooves (width of groove: 40 μm, depth of groove: 50 μm) was provided in a grid shape at an interval of 10 mm lengthwise and breadthwise respectively, which reached to the outer part portion) in which a semiconductor integrated circuit was formed on its surface was used.

<Evaluation Method>

The surface protecting adhesive film for the semiconductor wafer obtained in each of Examples or Comparative Examples was applied on the above-described surface of the semiconductor silicone wafer via the adhesive layer thereof and, then, the back side of the silicon wafer was subjected to grinding processing by using a grinding apparatus (Model: DFG860, manufactured by Disco Corporation) while the back side was being watered for cooling down to allow a thickness of the wafer to be 150 μm after grinding. Grinding processing was carried out on 10 pieces of the semiconductor silicone wafers for every adhesive film. After the grinding processing has been completed, in regard to the semiconductor silicone wafers, the wafer back side which has been subjected to the grinding processing was observed to inspect whether any breakage or crack was generated therein.

Next, the above-described adhesive film was peeled away by using an automatic detaping machine (Model: HR-8500II, manufactured by Nitto Seiki Inc., Detaping tape used: Highland-mark Filament Tape No. 897 (manufactured by Sumitomo 3M Limited) chuck table temperature: 50° C.) from the surface of the silicon wafer on which any breakage or crack was not observed. The surface of the silicon wafer after the adhesive film was peeled away was enlarged to a range of from 50 times to 1000 times by using an optical microscope (product name: OPTIPHOT2, manufactured by Nikon Corporation) and, then, presence of contamination due to penetration of grinding water and contamination due to an adhesive residue against all chips on the surface of the silicon wafer was observed; on this occasion, when one point or more of contaminations were detected, the related chips are counted as "contaminated chips" and, then, as for contamination due to penetration of grinding water and contamination due to an adhesive residue, a contamination generated ratio Cr was calculated in accordance with the following expression:

$Cr=(C2/C1)\times100$

Wherein Cr represents contamination generated ratio (%); C1 represents the number of observed chips; and C2 represents the number of contaminated chips.

Further, when the adhesive film was peeled using a surface protecting detaping machine, a peeling property was observed. When no errors occurred in any of a series of automatic peeling operations at the detaping machine, the related wafer was determined as acceptable for being peelable. On the other hand, in case there may occur peeling problems at the detaping machine such that the surface protecting adhesive film was not peeled and remained on the wafer surface, it was partly extended and broken, the wafer was detached from the chuck table while in operation and broken, or the like, thereby deteriorating workability, the related wafer was determined as unacceptable.

<Preparation of a Base Film>

Preparation Example 1 of a Base Film

One surface (a side on which an adhesive layer will be formed) of a polyethylene terephthalate film (hereinafter referred to also as PET) (product name: Tetoron, manufactured by Teijin Dupont Films Limited) having a thickness of 50 μm was subjected to corona discharge treatment. The storage elastic modulus (E') of this PET film was $5.0\times10^9$ Pa.

Preparation Example 2 of a Base Film

One surface (a side on which an adhesive layer will be formed) of a polyethylene naphthalate film (hereinafter referred to also as PEN) (product name: Teonex, manufactured by Teijin Dupont Films Limited) having a thickness of 75 μm was subjected to corona discharge treatment. The storage elastic modulus (E') of this PEN film was $6.1\times10^9$ Pa.

Preparation Example 3 of a Base Film

While an ethylene-vinyl acetate copolymer resin (hereinafter referred to also as EVA) having a Shore D hardness of 35 (product name: EVAFLEX P-1905 (EV460), manufactured by Dupont-Mitsui Polychemicals Co., Ltd.; vinyl acetate unit content: 19 weight %) was subjected to an extrusion-molding using a T-die extruder as a film having a thickness of 70 μm, it was pressed and laminated with a surface of PET film (product name: Tetoron, manufactured by Teijin Dupont Films Limited) prepared in advance having a thickness of 50 μm in a side which was subjected to corona discharge treatment to obtain an EVA/PET laminated film having a total thickness of 120 μm. Next, a surface (a side on which an adhesive layer will be formed) of a PET film side of the thus-obtained laminated film was subjected to corona discharge treatment. The storage elastic modulus (E') of the PET film used here was $5.0\times10^9$ Pa.

Preparation Example 4 of a Base Film

While an EVA resin (hereinafter referred to also as EVA) having a Shore D hardness of 35 (product name: EVAFLEXP-1905 (EV460), manufactured by Dupont-Mitsui Polychemicals Co., Ltd.; vinyl acetate unit content: 19 weight %) was subjected to an extrusion-molding using a T-die extruder as a film having a thickness of 100 μm, it was pressed and laminated with a surface of PET film (product name: Tetoron, manufactured by Teijin Dupont Films Limited) prepared in advance having a thickness of 15 μm in a side which was subjected to corona discharge treatment to obtain an EVA/PET laminated film having a total thickness of 115 μm. Next, a surface (a side on which an adhesive layer will be formed) of a PET film side of the thus-obtained laminated film was subjected to corona discharge treatment. The storage elastic modulus (E') of the PET film used here was $5.0\times10^9$ Pa.

<Preparation of an Acrylic Acid Alkyl Ester Copolymer>

Preparation Example 1 of an Acrylic Acid Alkyl Ester Copolymer

A polymerization reaction vessel was charged with 135 weight parts of deionized water, 0.5 weight part of ammonium persulfate, 73.25 weight parts of butyl acrylate, 11 weight parts of methyl methacrylate, 9 weight parts of 2-hydroxyethyl methacrylate, 2 weight parts of methacrylic acid, 1 weight part of acrylamide as a polymerization initiator, 3 weight parts of methacrylic acid glycidyl as a self-cross-linkable (cross-linkability in a molecule) comonomer, and 2 weight parts of a compound of a polyoxyethylene nonylphenyl ether (ethylene oxide: 20 moles) with a polymerizable 1-propenyl group introduced in a benzene ring thereof (product name: Aquaron RN-20, manufactured by Daiichi Kogyo Seiyaku Co., Ltd.) as a surfactant. The resultant mixture was subjected to an emulsion polymerization with stirred at 70°C. for 9 hours to obtain a water emulsion. The thus-obtained water emulsion was neutralized with 14 weight % of aqueous ammonia to obtain an emulsion (an adhesive agent) comprising an acrylic acid alkyl ester copolymer resin having a solid content of 40 weight %. The temperature at which tan δ of a dynamic viscoelasticity is maximized of this acrylic acid alkyl ester copolymer resin was −10° C.

Preparation Example 2 of an Acrylic Acid Alkyl Ester Copolymer

A polymerization reaction vessel was charged with 135 weight parts of deionized water, 0.5 weight part of 4,4'-azobis-4-cyanovaleric acid (product name: ACVA, manufactured by Otsuka Chemical Co., Ltd.), 57.25 weight parts of butyl acrylate, 30 weight parts of methyl methacrylate, 9 weight parts of 2-hydroxyethyl methacrylate, 2 weight parts of methacrylic acid, 1 weight part of acrylamide as a polymerization initiator, and 0.75 weight part of ammonium salt of sulfuric acid ether of polyoxyethylene nonylphenyl ether (average number of moles added of ethylene oxide: approximately 20) with a polymerizable 1-propenyl group introduced in a benzene ring (product name: Aquaron HS-20, manufactured by Daiichi Kogyo Seiyaku Co., Ltd.) as a water-soluble comonomer. The resultant mixture was subjected to an emulsion polymerization with stirred at 70° C. for 9 hours to obtain a water emulsion. The thus-obtained water emulsion was neutralized with 14 weight % of aqueous ammonia to obtain an emulsion (an adhesive agent) comprising an acrylic acid alkyl ester copolymer resin having a solid content of 40 weight %. The temperature at which tan δ of a dynamic viscoelasticity is maximized of this acrylic acid alkyl ester copolymer resin was 12° C.

Preparation Example 3 of an Acrylic Acid Alkyl Ester Copolymer

A polymerization reaction vessel was charged with 135 weight parts of deionized water, 0.5 weight part of ammonium persulfate, 91 weight parts of 2-ethylhexyl acrylate, 3 weight parts of 2-hydroxyethyl methacrylate, 2 weight parts of methacrylic acid, 1 weight part of acrylamide, 0.1 weight part of normal-dodecyl mercaptan as a polymerization initiator, 3 weight parts of methacrylic acid glycidyl as a self-cross-linkable (cross-linkability in a molecule) comonomer, and 2 weight parts of a compound of a polyoxyethylene nonylphenyl ether (ethylene oxide: 20 moles) with a polymerizable 1-propenyl group introduced in a benzene ring thereof (product name: Aquaron RN-20, manufactured by Daiichi Kogyo Seiyaku Co., Ltd.) as a surfactant. The resultant mixture was subjected to an emulsion polymerization with stirred at 70° C. for 9 hours to obtain a water emulsion. The thus-obtained water emulsion was neutralized with 14 weight % of aqueous ammonia to obtain an emulsion (an adhesive agent) comprising an acrylic acid alkyl ester copolymer resin having a solid content of 40 weight %. The temperature at which tan δ of a dynamic viscoelasticity is maximized of this acrylic acid alkyl ester copolymer resin was −39° C.

Comparative Preparation Example 1 of an Acrylic Acid Alkyl Ester Copolymer

A polymerization reaction vessel was charged with 135 weight parts of deionized water, 0.5 weight part of ammonium persulfate, 42 weight parts of ethyl acrylate, 30 weight parts of methyl methacrylate, 16 weight parts of butyl acrylate, 9 weight parts of 2-hydroxyethyl methacrylate, 2 weight parts of methacrylic acid, 1 weight part of acrylamide as a polymerization initiator, and 2 weight parts of a compound of a polyoxyethylene nonylphenyl ether (ethylene oxide: 20 moles) with a polymerizable 1-propenyl group introduced in a benzene ring thereof (product name: Aquaron RN-20, manufactured by Daiichi Kogyo Seiyaku Co., Ltd.) as a surfactant. The resultant mixture was subjected to an emulsion polymerization with stirred at 70°C. for 9 hours to obtain a water emulsion. The thus-obtained water emulsion was neutralized with 14 weight % of aqueous ammonia to obtain an emulsion (an adhesive agent) comprising an acrylic acid alkyl ester copolymer resin having a solid content of 40 weight %. The temperature at which tan δ of a dynamic viscoelasticity is maximized of this acrylic acid alkyl ester copolymer was 58°C.

Example 1

100 weight parts of an emulsion produced in Preparation Example 1 of an Acrylic Acid Alkyl Ester Copolymer was added with 50 weight parts of an emulsion produced in Preparation Example 2 of an Acrylic Acid Alkyl Ester Copolymer and further added with 1.2 weight parts of epoxy cross-linking agent (product name: DENACOL EX-614, manufactured by Nagase Chemical Ltd.) and 5 weight parts of diethylene glycol monobutyl ether to obtain an adhesive agent coating solution. The adhesive agent coating solution was applied by using a roll coater on one surface of a polypropylene film (release film) having a thickness of 50 μm and dried at 120° C. for 3 minutes to obtain an adhesive layer having a thickness of 15 μm. On the thus-obtained adhesive layer, a surface of the above-described base film obtained in Preparation Example 1 of a Base Film in a side which has been subjected to corona discharge treatment was laminated by using a dry laminator and, then, pressed to allow the adhesive layer to be transferred. Thereafter, the resultant laminate was heated at 60° C. for 48 hours and, then, cooled down to room temperature to obtain a surface protecting adhesive film for a semiconductor wafer. The adhesive force of the adhesive film was 7.8 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water and contamination due to an adhesive residue was found on the wafer surface. The results are shown in Table 1.

Example 2

A surface protecting adhesive film for a semiconductor wafer was obtained in the same manner as in Example 1 except that, the film produced in Preparation Example 2 of a Base Film as a base film is used, in preparing the adhesive agent coating solution in Example 1, an added quantity of an emulsion produced in Preparation Example 2 of an Acrylic Acid Alkyl Ester Copolymer was 80 weight parts, a quantity of a cross-linking agent added was 0.36 weight part and the thickness of the adhesive layer was 20 μm. An adhesive force of this adhesive film was 10.1 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water and contamination due to an adhesive residue was found on the wafer surface. The results are shown in Table 1.

Example 3

A surface protecting adhesive film for a semiconductor wafer was obtained in the same manner as in Example 1 except that, the film produced in Preparation Example 3 of a Base Film as a base film is used, in preparing the adhesive agent coating solution of Example 1, an added quantity of an emulsion produced in Preparation Example 2 of an Acrylic Acid Alkyl Ester Copolymer was 20 weight parts, a quantity of a cross-linking agent added was 2.4 weight parts and the thickness of the adhesive layer was 35 μm. An adhesive force of this adhesive film was 4.9 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water and contamination due to an adhesive residue was found on the wafer surface. The results are shown in Table 1.

Example 4

A surface protecting adhesive film for a semiconductor wafer was obtained in the same manner as in Example 1 except that, in preparing the adhesive agent coating solution of Example 1, an emulsion produced in Preparation Example 3 of an Acrylic Acid Alkyl Ester Copolymer was used instead of an emulsion produced in Preparation Example 1 of An Acrylic Acid Alkyl Ester Copolymer and an added quantity thereof was 50 weight parts. An adhesive force of this adhesive film was 5.5 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water and contamination due to an adhesive residue was found on the wafer surface. The results are shown in Table 1.

Example 5

A surface protecting adhesive film for a semiconductor wafer was obtained in the same manner as in Example 1 except that, the film produced in Preparation Example 4 of a Base Film as a base film is used. An adhesive force of this adhesive film was 3.6 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water and contamination due to an adhesive residue was found on the wafer surface. The results are shown in Table 1.

Comparative Example 1

A surface protecting adhesive film for a semiconductor wafer was obtained in the same manner as in Example 1 except that, in producing the adhesive agent coating solution of Example 1, an added quantity of an emulsion produced in Preparation Example 2 of an Acrylic Acid Alkyl Ester Copolymer was 5 weight parts and a quantity of a cross-linking agent added was 0.84 weight part. An adhesive force of this adhesive film was 5.4 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to an adhesive residue was found, but contamination due to penetration of grinding water was observed in 8% of chips in number based on the total number of chips. The results are shown in Table 2.

Comparative Example 2

A surface protecting adhesive film for a semiconductor wafer was obtained in the same manner as in Example 1 except that, in producing the adhesive agent coating solution of Example 1, an added quantity of an emulsion produced in Preparation Example 2 of an Acrylic Acid Alkyl Ester Copolymer was 120 weight parts and a quantity of a cross-linking agent added was 1.76 weight parts. An adhesive force of this adhesive film was 3.3 N/25 mm. Using the thus-obtained adhesive film, a practical performance evaluation was carried out according to the foregoing method. After the grinding processing has been completed, 3 wafers out of 10 wafers were found broken. In the rest 7 wafers, after the adhesive film has been peeled away, no contamination was observed on the wafer surface, but contamination due to penetration of grinding water was observed in 35% of chips in number based on the total number of chips. The results are shown in Table 2.

Comparative Example 3

A surface protecting adhesive film for a semiconductor wafer was obtained in the same manner as in Example 1 except that, the thickness of the adhesive layer was 70 μm. An adhesive force of this adhesive film was 19.1 N/25 mm. Using the thus-obtained adhesive film, a practical performance evaluation was carried out according to the foregoing method. After the grinding processing has been completed, no breakage or crack was detected on the wafer back side. However, at the time of peeling using a detaping machine, there has been occurred a bad peeling such that peeling operation was stopped by detaching wafers from the vacuum chuck table at the detaping machine based on the total 10 wafers; therefore, the adhesive film cannot be peeled away from. The results are shown in Table 2.

Comparative Example 4

A surface protecting adhesive film for a semiconductor wafer was obtained in the same manner as in Example 1 except that a quantity of a cross-linking agent added was 7.5 weight parts. An adhesive force of this adhesive film was 3.5 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to an adhesive residue was found on the wafer surface, but contamination due to penetration of grinding water was observed in 38% of chips in number based on the total number of chips. The results are shown in Table 2.

Comparative Example 5

A surface protecting adhesive film for a semiconductor wafer was obtained in the same manner as in Example 1 except that a quantity of a cross-linking agent added was 0.03 weight part. An adhesive force of this adhesive film was 4.9 N/25 mm. Using the thus-obtained adhesive film, a practical performance evaluation was carried out according to the foregoing method. After the grinding processing has been completed, no breakage or crack was detected on the wafer back side. After the adhesive film has been peeled away, no contamination due to penetration of grinding water was found on the wafer surface, but contamination due to an adhesive residue was observed in 2.6% of chips in number based on the total number of chips. The results are shown in Table 2.

Comparative Example 6

A surface protecting adhesive film for a semiconductor wafer was obtained in the same manner as in Example 1 except that, in preparing the adhesive agent coating solution of Example 1, an acrylic acid alkyl ester copolymer adjusted in Comparative Preparation Example 1 of an Acrylic Acid alkyl Ester Copolymer was used instead of an acrylic acid alkyl ester copolymer produced in Preparation Example 2 of an Acrylic Acid Alkyl Ester Copolymer, an added quantity thereof was 20 weight parts, a quantify of a cross-linking agent added was 0.24 weight part and the thickness of the adhesive layer was 35 μm. An adhesive force of this adhesive film was 2.8 N/25 mm. Using the thus-obtained adhesive film, a practical performance evaluation was carried out according to the foregoing method. After the grinding processing has been completed, 2 wafers out of 10 wafers were found broken. In the rest 8 wafers, after the adhesive film has been peeled away, no contamination due to an adhesive residue was found on the wafer surface, but contamination due to penetration of grinding water was observed in 32% of chips in number based on the total number of chips. The results are shown in Table 3.

Comparative Example 7

A surface protecting adhesive film for a semiconductor wafer was obtained in the same manner as in Example 1 except that, in preparing the adhesive agent coating solution of Example 1, an emulsion produced in Preparation Example 2 of an Acrylic Acid Alkyl Ester Copolymer was not added and a quantify of a cross-linking agent added was 0.80 weight part. An adhesive force of this adhesive film was 4.7 N/25 mm. Using this thus-obtained adhesive film, a practical performance evaluation was carried out according to the foregoing method. After the grinding processing has been completed, no breakage or crack was detected on the wafer back side. After the adhesive film has been peeled away, no contamination due to an adhesive residue was found on the wafer surface, but contamination due to penetration of grinding water was observed in 10% of chips in number based on the total number of chips. The results are shown in Table 2.

Comparative Example 8

A surface protecting adhesive film for a semiconductor wafer was obtained in the same manner as in Example 1 except that, in preparing the adhesive agent coating solution of Example 1, an emulsion produced in Preparation Example 1 of an Acrylic Acid Alkyl Ester Copolymer was not used, 100 weight parts of an emulsion produced in Preparation Example 2 of an Acrylic Acid Alkyl Ester Copolymer was added with 0.80 weight part of an epoxy cross-linking agent (produce name: DENACOL EX-614, manufactured by Nagase Chemical Ltd.) and 5 weight parts of diethylene glycol monobutyl ether to obtain an adhesive agent coating solution. An adhesive force of this adhesive film was 1.8 N/25 mm. Using the thus-obtained adhesive film, a practical performance evaluation was carried out according to the foregoing method. After the grinding processing has been completed, 5 wafers out of 10 wafers were found broken. After the adhesive film has been peeled away, no contamination due to an adhesive residue was found on the wafer surface, but contamination due to penetration of grinding water was observed in 38% of chips in number based on the total number of chips. The results are shown in Table 2.

TABLE 1

|  | Example 1 | Example 2 | Example 3 | Example 4 | Example 5 |
|---|---|---|---|---|---|
| Type of Base Film | PET | PEN | EVA/PET | PET | EVA/PET |
| Base Film *1 Storate Elastic Modulus (E') (Pa) | $5.0 \times 10^9$ | $6.1 \times 10^9$ | $5.0 \times 10^9$ | $5.0 \times 10^9$ | $5.0 \times 10^9$ |
| Thickness of Base Film (μm) *1 | 50 | 75 | 50 | 50 | 15 |
| Temperature at which tan δ is maximized of copolymer (A) (° C.) | −10 | −10 | −10 | −39 | −10 |
| Temperature at which tan δ is maximized of copolymer (B) (° C.) | 12 | 12 | 12 | 12 | 12 |
| Quantity of Copolymer (B) Added (Parts by Weight) *2 | 50 | 80 | 20 | 50 | 50 |
| Quantity of Cross-linking Agent Added (Parts by Weight) *3 | 2.0 | 0.5 | 5.0 | 2.0 | 2.0 |
| Thickness of Adhesive Layer (μm) | 15 | 20 | 35 | 15 | 15 |
| Adhesive Force (N/25 mm) | 7.8 | 10.1 | 4.9 | 5.5 | 3.6 |
| Breakage, Crack of Wafers in Grinding (Number of wafers) | Null | Null | Null | Null | Null |

TABLE 1-continued

|  | Example 1 | Example 2 | Example 3 | Example 4 | Example 5 |
|---|---|---|---|---|---|
| Peeling Property by Detaping Machine | Acceptable | Acceptable | Acceptable | Acceptable | Acceptable |
| Contamination Generated Ratio Cr due to Penetration of Grinding Dust (%) | 0 | 0 | 0 | 0 | 0 |
| Contamination Generated Ratio Cr due to an Adhesive Residue (%) | 0 | 0 | 0 | 0 | 0 |

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Type of Base Film | PET | PET | PET | PET | PET | PET | PET | PET |
| Base Film *1 Storate Elastic Modulus (E') (Pa) | $5.0 \times 10^9$ | $5.0 \times 10^9$ | $5.0 \times 10^9$ | $5.0 \times 10^9$ | $5.0 \times 10^9$ | $5.0 \times 10^9$ | $5.0 \times 10^9$ | $5.0 \times 10^9$ |
| Thickness of Base Film (μm) *1 | 50 | 50 | 50 | 50 | 50 | 50 | 50 | 50 |
| Temperature at which tan δ is maximized of copolymer (A) (° C.) | −10 | −10 | −10 | −10 | −10 | −10 | −10 | — |
| Temperature at which tan δ is maximized of copolymer (B) (° C.) | 12 | 12 | 12 | 12 | 12 | 58 | — | 12 |
| Quantity of Copolymer (B) Added (Parts by Weight) *2 | 5 | 120 | 50 | 50 | 50 | 20 | — | Adhesive Layer formed on Copolymer B only |
| Quantity of Cross-linking Agent Added (Parts by Weight) *3 | 2.0 | 2.0 | 2.0 | 12.5 | 0.05 | 0.5 | 2.0 | 2.0 |
| Thickness of Adhesive Layer (μm) | 15 | 15 | 70 | 15 | 15 | 35 | 15 | 15 |
| Adhesive Force (N/25 mm) | 5.4 | 3.3 | 19.1 | 3.5 | 4.9 | 2.8 | 4.7 | 1.8 |
| Breakage, Crack of Wafers in Grinding (Number of wafers) | Null | 3 Wafers (broken) | Null | Null | Null | 2 Wafers (broken) | Null | 5 Wafers (broken) |
| Peeling Property by Detaping Machine | Acceptable | Acceptable | 10 Wafers (bad peeling) | Acceptable | Acceptable | Acceptable | Acceptable | Acceptable |
| Contamination Generated Ratio Cr due to Penetration of Grinding Dust (%) | 8 | 35 | — | 38 | 0 | 32 | 10 | 38 |
| Contamination Generated Ratio Cr due to an Adhesive Residue (%) | 0 | 0 | — | 0 | 2.6 | 0 | 0 | 0 |

<Description of Tables 1 and 2>
*1: Indicates a storage elastic modulus and thickness of the base film on which an adhesive layer was formed.
*2: Indicates an added quantity of an acrylic acid alkyl ester copolymer (B) based on 100 weight parts of an acrylic acid alkyl ester copolymer (A).
*3: Indicates a quantity of a cross-linking agent based on 100 weight parts of total amount of the acrylic acid alkyl ester copolymers (A) and (B).

INDUSTRIAL APPLICABILITY

According to the present invention, by using a surface protecting adhesive film for a semiconductor wafer, it is possible to adhere closely to the unevenness of the surface of a semiconductor wafer and prevent contamination and breakage due to penetration of grinding water on the wafer surface even in the shape of the surface of a semiconductor wafer into which grinding water can easily enter and even under grinding conditions. Further, a proper adhesive force can be carried out at the time of peeling, thereby achieving an excellent contamination resistance without wafer breakage and deteriorating peeling workability, and without contaminating the wafer due to any adhesive residue left on the wafer surface after peeling.

The invention claimed is:

1. A surface protecting adhesive film for a semiconductor wafer comprising:
a base film which comprises at least one layer of a synthetic resin wherein the base film has a storage elastic modulus (E') at 25° C. of from $1 \times 10^8$ to $1 \times 10^{10}$ Pa and wherein the base film has a thickness of 10 μm to 120 μm; and
an adhesive layer of 5 to 50 μm in thickness formed on one surface of the base film, wherein the adhesive layer comprises 100 weight parts of a polymer (A) having a functional group capable of reacting with a cross-linking agent and a temperature (Ta) in a range of from −50° C. to 5° C. at which tan δ of a dynamic viscoelasticity of the polymer(A) is maximized, from 10 weight parts to 100 weight parts of a polymer (B) having a functional group capable of reacting with a cross-linking agent and a temperature (Tb) in a range of from more than 5° C. to 50° C. at which tan δ of a dynamic viscoelasticity of the polymer(B) is maximized, and from 0.1 weight part to 10 weight parts of a cross-linking agent (C) having two or more cross-linkable functional groups in a molecule based on 100 weight parts of total amount of the polymers (A) and (B), and wherein the adhesive force of the surface protecting adhesive film for the semiconductor wafer measured on the basis of a method defined in JIS Z0237 using a SUS304-BA plate as an adherend, at a peeling rate of 300 mm/min and a peeling angle of 180° is from 1 N/25 mm to 15 N/25 mm.

2. The surface protecting adhesive film for the semiconductor wafer according to claim 1, wherein polymers (A) and (B) are acrylic acid alkyl ester copolymers.

3. A protecting method for a semiconductor wafer comprising the steps of: applying a surface protecting adhesive film for the semiconductor wafer on a circuit-forming surface of the semiconductor wafer via an adhesive layer thereof; grinding a non-circuit-formed surface of the semiconductor wafer; and peeling away the surface protecting adhesive film for the semiconductor wafer, wherein the surface protecting adhesive film for the semiconductor wafer according to claim 2 is used in the protecting method for the semiconductor wafer.

4. A protecting method for a semiconductor wafer comprising the steps of: applying a surface protecting adhesive film for the semiconductor wafer on a circuit-forming surface of the semiconductor wafer via an adhesive layer thereof; grinding a non-circuit-formed surface of the semiconductor wafer; and peeling away the surface protecting adhesive film for the semiconductor wafer, wherein the surface protecting adhesive film for the semiconductor wafer according to claim 1 is used in the protecting method for the semiconductor wafer.

* * * * *